United States Patent
Yamada

(10) Patent No.: US 9,520,337 B2
(45) Date of Patent: Dec. 13, 2016

(54) SEMICONDUCTOR MODULE

(71) Applicant: FUJI ELECTRIC CO., LTD., Kawasaki-shi (JP)

(72) Inventor: Takafumi Yamada, Matsumoto (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 14/939,531

(22) Filed: Nov. 12, 2015

(65) Prior Publication Data
US 2016/0064308 A1    Mar. 3, 2016

Related U.S. Application Data

(63) Continuation of application No. PCT/JP2014/072897, filed on Sep. 1, 2014.

(30) Foreign Application Priority Data

Oct. 29, 2013  (JP) ................ 2013-224425

(51) Int. Cl.
H01L 23/373  (2006.01)
H01L 23/14   (2006.01)
H01L 23/34   (2006.01)
H01L 23/473  (2006.01)
H01L 25/07   (2006.01)
(Continued)

(52) U.S. Cl.
CPC ......... H01L 23/3735 (2013.01); H01L 23/142 (2013.01); H01L 23/3157 (2013.01);
(Continued)

(58) Field of Classification Search
CPC ........ H01L 23/142; H01L 23/34; H01L 23/36; H01L 23/367; H01L 23/3675; H01L 23/373; H01L 23/3735; H01L 23/46; H01L 23/4735; H01L 23/488; H01L 23/49811
See application file for complete search history.

(56) References Cited

U.S. PATENT DOCUMENTS

2001/0033477 A1  10/2001 Inoue et al.
2007/0216013 A1   9/2007 Funakoshi et al.
(Continued)

FOREIGN PATENT DOCUMENTS

JP  2001-308263 A  11/2001
JP  2004-311685 A  11/2003
(Continued)

OTHER PUBLICATIONS

PCT, "International Search Report for International Application No. PCT/JP2014/072897".

Primary Examiner — Eduardo A Rodela
(74) Attorney, Agent, or Firm — Manabu Kanesaka

(57) ABSTRACT

A semiconductor module includes first and second semiconductor elements connected to pins, respectively; a first pin wiring substrate having first and second metal films bonded to the pin on the upper and lower surfaces; a first DCB substrate having third and fourth metal films on the upper and lower surfaces, the third metal film being bonded to the lower surface of the first semiconductor element; a second DCB substrate having fifth and sixth metal films respectively provided on the lower and upper surfaces, the fifth metal film being bonded to the upper surface of the second semiconductor element; a second pin wiring substrate having seventh and eighth metal films bonded to the pin, on the upper and lower surfaces; a connection member connected to the second and fifth metal films; a first cooler connected to the fourth metal film; and a second cooler connected to the sixth metal film.

8 Claims, 6 Drawing Sheets

(51) Int. Cl.
*H01L 25/10* (2006.01)
*H01L 25/11* (2006.01)
*H01L 25/18* (2006.01)
*H01L 23/00* (2006.01)
*H01L 23/433* (2006.01)
*H01L 23/498* (2006.01)
*H01L 23/538* (2006.01)
*H01L 23/31* (2006.01)

(52) U.S. Cl.
CPC ............ *H01L 23/34* (2013.01); *H01L 23/373* (2013.01); *H01L 23/4334* (2013.01); *H01L 23/473* (2013.01); *H01L 23/49811* (2013.01); *H01L 23/5385* (2013.01); *H01L 24/01* (2013.01); *H01L 24/17* (2013.01); *H01L 25/07* (2013.01); *H01L 25/10* (2013.01); *H01L 25/11* (2013.01); *H01L 25/18* (2013.01); *H01L 2224/16225* (2013.01); *H01L 2924/0002* (2013.01); *H01L 2924/13055* (2013.01); *H01L 2924/13091* (2013.01)

(56) References Cited

U.S. PATENT DOCUMENTS

| | | |
|---|---|---|
| 2009/0116197 A1 | 5/2009 | Funakoshi et al. |
| 2011/0037166 A1 | 2/2011 | Ikeda et al. |
| 2012/0241953 A1 | 9/2012 | Yamada et al. |
| 2013/0277800 A1 | 10/2013 | Hori et al. |
| 2015/0179551 A1* | 6/2015 | Nakamura ............ H01L 23/481 257/773 |

FOREIGN PATENT DOCUMENTS

| | | |
|---|---|---|
| JP | 2006-210605 A | 8/2006 |
| JP | 2007-251076 A | 9/2007 |
| JP | 2009-117428 A | 5/2009 |
| JP | 2010-129801 A | 6/2010 |
| JP | 2013-098343 A | 5/2013 |
| JP | 2013-222950 A | 10/2013 |
| WO | 2009/125779 A1 | 10/2009 |
| WO | 2011/083737 A1 | 7/2011 |

* cited by examiner

SEMICONDUCTOR MODULE

CROSS-REFERENCES TO RELATED APPLICATIONS

The present application is a Continuation Application of PCT International Application No. PCT/JP2014/072897 filed Sep. 1, 2014, and claiming priority from Japanese Application No. 2013-224425 filed Oct. 29, 2013, the disclosure of which is incorporated herein.

TECHNICAL FIELD

The present invention relates to a semiconductor module that uses pin bonding and can improve cooling capacity.

BACKGROUND ART

The following Patent Documents 1 and 2 disclose a semiconductor module with improved cooling capacity.

Patent Document 1 discloses a structure in which a semiconductor chip and a metal plate are provided between insulating substrates, each of which has metal films formed on both surfaces, and the outer surface of each insulating substrate is bonded to a cooler.

Patent Document 2 discloses a structure in which a semiconductor chip and lead electrodes are provided between insulating substrates, each of which has metal films formed on both surfaces, a copper base is provided on the outer surface of each insulating substrate, and a heat sink (cooler) is provided on the outer surface of each copper base (radiator plate).

Patent Document 3 discloses a semiconductor module using pin bonding. Patent Document 3 discloses a structure in which a semiconductor chip and a printed circuit board are connected by an implant pin.

Patent Document 4 discloses a device in which power semiconductor elements deviate from each other such that the heating centers thereof do not face each other. In the device disclosed in Patent Document 4, one chip is provided in one module and the upper and lower surfaces of each module are cooled by a cooler.

Patent Document 5 discloses a structure in which module units, each having a cylindrical conductive body provided on a wall surface, are provided on the upper and lower sides so as to face each other and are connected by external terminals.

Patent Document 6 discloses a power semiconductor device in which insulating substrates, each having an insulated gate bipolar transistor (IGBT) and a free wheeling diode (FWD) stacked thereon, are provided so as to face each other and are connected through U-shaped output terminals. An input terminal and an output terminal extend from between the insulating substrates to the outside.

CITATION LIST

Patent Document

Patent Document 1: WO2009/125779
Patent Document 2: JP 2007-251076 A
Patent Document 3: WO2011/083737
Patent Document 4: JP 2006-210605 A
Patent Document 5: JP 2010-129801 A

DISCLOSURE OF THE INVENTION

Problem to be Solved by the Invention

Patent Document 1 has the problem that thermal stress is applied between the wire and the electrode which are connected to each other by wire bonding when power is supplied to the semiconductor element and the wire is likely to be detached from the electrode when the semiconductor element is repeatedly turned on and off for a long time.

In Patent Document 2, the lead electrode replaces the wire disclosed in Patent Document 1. Therefore, there is a concern that the same detachment phenomenon as that in Patent Document 1 will occur.

Patent Document 3 discloses the semiconductor module with the pin bonding structure which is considered as measures to suppress the above-mentioned detachment phenomenon. However, the structure of the semiconductor module has the problem that cooling capacity is low since only one surface of the semiconductor element is cooled and it is difficult for the semiconductor element to sufficiently exhibit its performance.

Patent Document 4 has the problem such that the volume of the device is large since one chip is provided in one module.

In the structure disclosed in Patent Document 5, the external terminal is inserted into the cylindrical conductive body and is electrically connected thereto. Therefore, there is a concern that reliability will be lower than that in a soldering structure. In addition, after the upper and lower module units are molded with a resin, a plurality of external terminals is inserted. Therefore, it is necessary to accurately position the cylindrical conductive bodies.

In the structure disclosed in Patent Document 6, the contact area between the semiconductor element and the lead frame is large. Therefore, when the semiconductor device is repeatedly turned on and off, thermal stress caused by the difference between the thermal expansion coefficients of these members occurs in the interface. As a result, when the semiconductor device is used for a long time, there is a concern that the members will be detached from each other.

The invention has been made in order to solve the above-mentioned problems and an object of the invention is to provide a semiconductor module which uses pin bonding and can improve cooling capacity.

Means for Solving Problem

Regarding a semiconductor module using pin bonding, the inventor discovered that by providing a first DCB substrate having a first semiconductor element and a second DCB substrate having a second semiconductor element so as to face each other while being separated from each other, positioning the first semiconductor element and the second semiconductor element such that they partially overlapped each other, and electrically and thermally connecting the first and second semiconductor elements to each other, coolers provided on the upper and lower surfaces of the semiconductor module cool the first and second semiconductor elements, which made it possible to reduce the size of the semiconductor module and to improve cooling efficiency even when two semiconductor elements were provided in one semiconductor module. As a result, the invention was achieved.

In order to solve the above-mentioned problems, according to a first embodiment of the invention, there is provided a semiconductor module including: a first semiconductor element; a first pin that is electrically and thermally connected to one surface of the first semiconductor element; a first pin wiring substrate that includes a first pin wiring insulating substrate, a first metal film provided on a lower surface of the first pin wiring insulating substrate, and a second metal film provided on an upper surface of the first pin wiring insulating substrate, the first metal film and the second metal film being electrically bonded to the first pin; a first DCB substrate that includes a first ceramic insulating substrate, a third metal film provided on an upper surface of the first ceramic insulating substrate, and a fourth metal film provided on a lower surface of the first ceramic insulating substrate, the third metal film being bonded to a lower surface of the first semiconductor element; a second semiconductor element; a second pin that is electrically and thermally connected to a lower surface of the second semiconductor element; a second pin wiring substrate that includes a second pin wiring insulating substrate, a seventh metal film provided on an upper surface of the second pin wiring insulating substrate, and an eighth metal film provided on a lower surface of the second pin wiring insulating substrate, the seventh metal film and the eighth metal film being electrically bonded to the second pin; a second DCB substrate that includes a second ceramic insulating substrate, a fifth metal film provided on a lower surface of the second ceramic insulating substrate, and a sixth metal film provided on an upper surface of the second ceramic insulating substrate, the fifth metal film being bonded to an upper surface of the second semiconductor element; a connection member having both ends which are electrically connected to the second metal film and the fifth metal film; a first cooler that is thermally connected to the fourth metal film; and a second cooler that is thermally connected to the sixth metal film.

According to the above-mentioned structure, heat generated from the first semiconductor element is transferred from the lower surface of the first semiconductor element to the first cooler through the first DCB substrate and is also transferred to the second cooler through the pin connected to the upper surface of the first semiconductor element, the first pin wiring substrate, and the connection member. In addition, heat generated from the second semiconductor element is transferred from the upper surface of the second semiconductor element to the second cooler through the second DCB substrate and is also transferred to the first cooler through the second DCB substrate, the connection member, the first pin wiring substrate, the first pin, the first semiconductor element, and the first DCB substrate.

Therefore, in the semiconductor module according to the invention, the pin wiring substrate functions not only as a wiring substrate but also as a heat spreader for increasing a heat transfer area and heat is transferred to the first cooler and the second cooler through the connection member. Therefore, it is possible to improve cooling capacity.

In the above-mentioned semiconductor module, a first heat spreader may be provided between the first semiconductor element and the third metal film so as to be electrically and thermally connected to the first semiconductor element and the third metal film and a second heat spreader may be provided between the second semiconductor element and the fifth metal film so as to be electrically and thermally connected to the second semiconductor element and the fifth metal film.

In some cases, the first ceramic insulating substrate and the second ceramic insulating substrate have lower thermal conductivity than metal. However, according to the above-mentioned structure, heat is quickly transferred from the first semiconductor element to the first heat spreader and from the second semiconductor element to the second heat spreader. Then, the heat is transferred from the first heat spreader and the second heat spreader with a large heat transfer area to the first ceramic insulating substrate and the second ceramic insulating substrate. Therefore, a heat transmission area increases. As a result, it is possible to effectively cool the semiconductor module. An increase in the thickness of the heat spreader makes it possible to suppress an increase in the temperature of the semiconductor element using a buffering effect which is obtained by the thermal capacity of the heat spreader when the amount of heat generated from the semiconductor element increases rapidly.

In the above-mentioned semiconductor module, a third heat spreader may be provided between the fourth metal film and the first cooler so as to be thermally connected to the fourth metal film and the first cooler and a fourth heat spreader may be provided between the sixth metal film and the second cooler so as to be thermally connected to the sixth metal film and the second cooler. According to this structure, it is possible to improve thermal conductivity between the first DCB substrate and the first cooler and between the second DCB substrate and the second cooler and thus to improve the cooling capacity of the semiconductor module.

The above-mentioned semiconductor module may further include a terminal that is electrically connected to the first semiconductor element or the second semiconductor element. The terminal may extend from a position between the first cooler and the second cooler to the outside. According to this structure, since the terminal extends from the position that is away from the first cooler and the second cooler, it is possible to ensure an insulation distance between the cooler and the terminal.

According to another embodiment of the invention, there is provided a semiconductor module including a plurality of semiconductor module units each of which has, as a unit module, the above-mentioned semiconductor module. The plurality of semiconductor module units is arranged in a row such that surfaces from which each terminal does not protrude face each other. According to this structure, a plurality of semiconductor modules can be integrated into one inverter. When a plurality of semiconductor modules is integrally manufactured at the beginning, the risk that a defective component will be included in the product increases, which results in a reduction in yield. When the individual semiconductor module units are combined with each other after inspection, only a defective semiconductor module can be replaced. As a result, it is possible to reduce loss costs.

In the semiconductor module in which the plurality of semiconductor module units is arranged in a row, each of the first cooler and the second cooler may be integrated with the semiconductor module units so as to entirely cover both side surfaces of the row of the semiconductor module units. According to this structure, only two large coolers are required. Therefore, it is possible to reduce the number of components and thus to reduce assembly costs.

In the above-mentioned semiconductor module, the semiconductor module may be sealed with a sealing resin except for a bonding surface between the first cooler and the fourth metal film of the first cooler in the semiconductor module, a bonding surface between the second cooler and the sixth metal film of the second cooler in the semiconductor module, and regions of the terminals which extend to the outside. According to this structure, the contact of the semiconductor element with the outside can be prevented by the sealing resin. Therefore, it is possible to protect the semiconductor element.

In the above-mentioned semiconductor module, the terminal may extend to the outside of the semiconductor module in a direction parallel to one direction. The first cooler may include a first cooling medium inlet through which a cooling medium is introduced and a first cooling medium outlet through which the cooling medium is discharged. The second cooler may include a second cooling medium inlet through which a cooling medium is introduced and a second cooling medium outlet through which the cooling medium is discharged. The first cooling medium inlet, the first cooling medium outlet, the second cooling medium inlet, and the second cooling medium outlet may extend in a direction perpendicular to a direction in which the terminal extends so as be separated from the terminal. According to this structure, since the terminals are separated from the cooling medium inlet and the cooling medium outlet, it is possible to improve assemblability.

Effect of the Invention

According to the invention, it is possible to provide a semiconductor module which uses pin bonding and can improve cooling capacity.

MODE(S) FOR CARRYING OUT THE INVENTION

Figure 1:
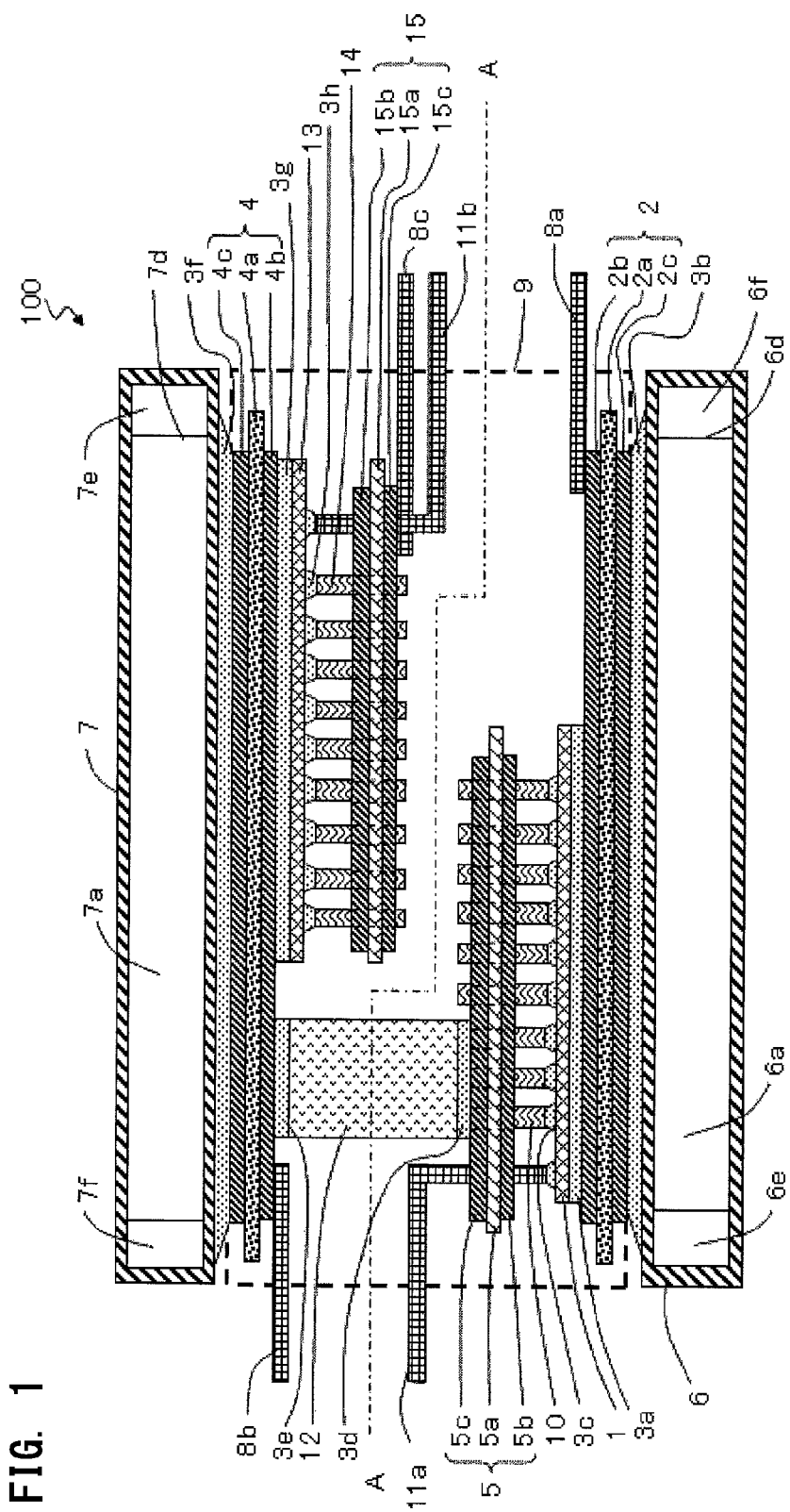
FIG. 1 is a cross-sectional view illustrating a semiconductor module according to a first embodiment of the invention.

Hereinafter, embodiments of a semiconductor module according to the invention will be described with reference to the drawings. The same components are denoted by the same reference numerals and the description thereof will not be repeated. The invention is not limited to the following embodiments and can be appropriately modified without departing from the scope and spirit of the invention.

First Embodiment

Figure 2A:
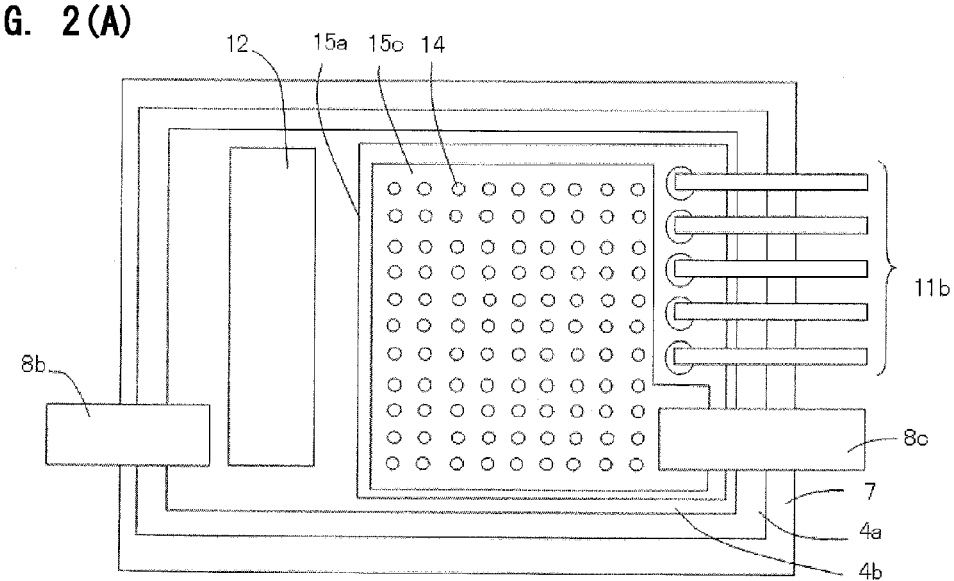
FIG. 2(A) is a cross-sectional view illustrating the cross section taken along the line A-A of FIG. 1, as viewed from the bottom.
Figure 2B:
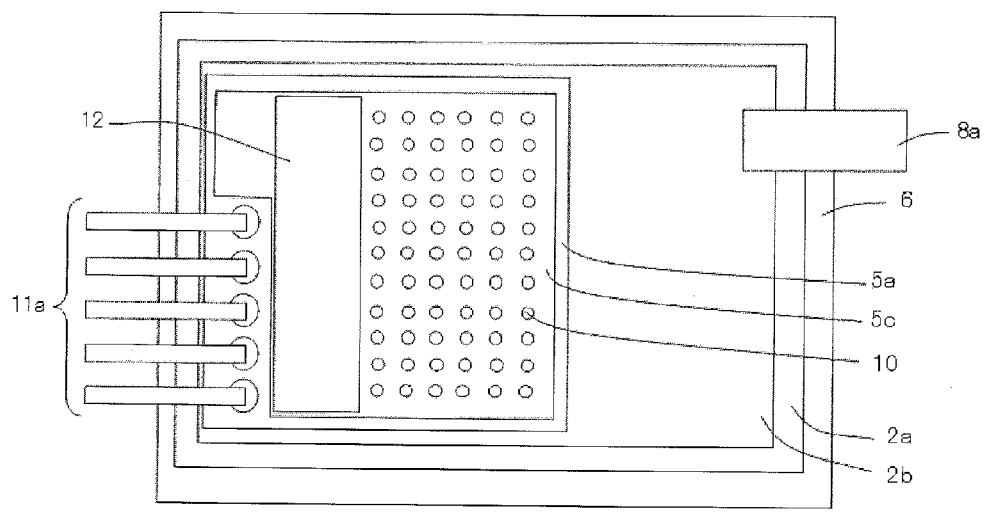
FIG. 2(B) is a cross-sectional view illustrating the cross section taken along the line A-A of FIG. 1, as viewed from the top.
Figure 3:
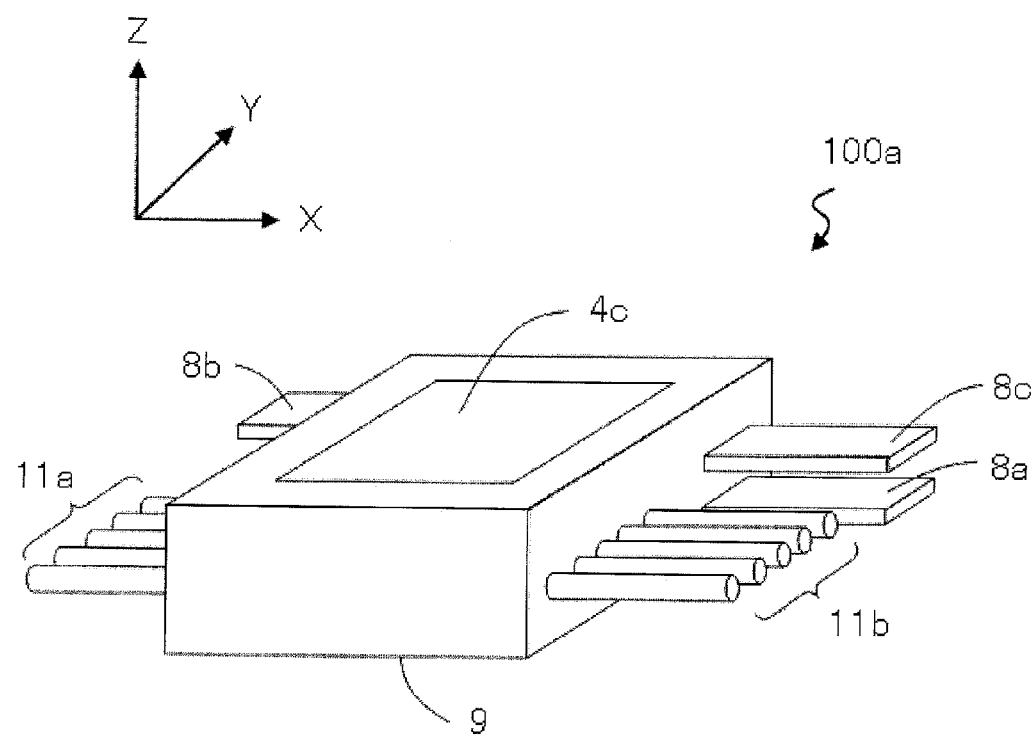
FIG. 3 is a perspective view illustrating a semiconductor module unit excluding the upper and lower coolers and solder illustrated in FIG. 1.
Figure 4:
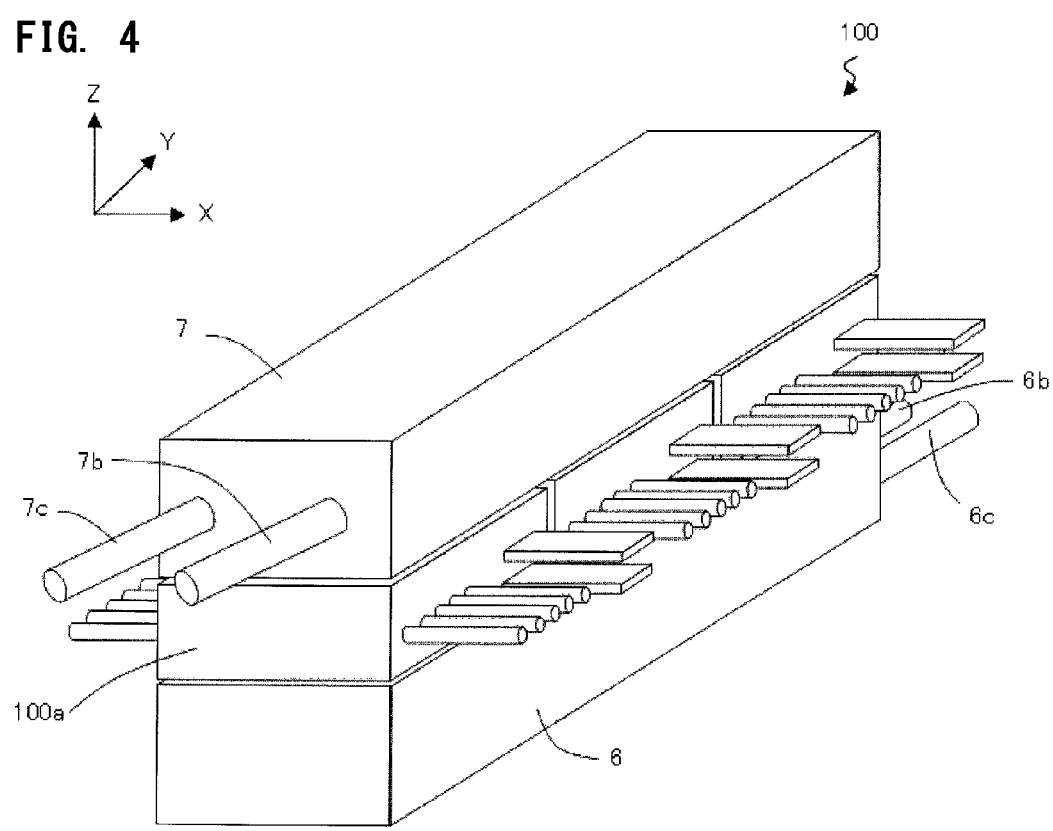
FIG. 4 is a perspective view illustrating a semiconductor module in which a plurality of semiconductor module units, each of which has, as a unit module, the semiconductor module according to the first embodiment of the invention, is arranged in a row.

A first embodiment of the invention will be described. FIG. 1 is a cross-sectional view illustrating a semiconductor module according to the first embodiment of the invention. FIG. 2(A) is a cross-sectional view illustrating the cross section taken along the line A-A of FIG. 1, as viewed from the top, and FIG. 2(B) a cross-sectional view illustrating the cross section taken along the line A-A of FIG. 1, as viewed from the bottom. FIG. 3 is a perspective view illustrating the semiconductor module except the upper and lower coolers and solder illustrated in FIG. 1. FIG. 4 is a perspective view illustrating a semiconductor module in which a plurality of semiconductor module units, each of which has the semiconductor module according to the first embodiment of the invention as a unit module, is arranged in a row.

A semiconductor module 100 according to the first embodiment of the invention includes a first semiconductor element 1, a first DCB substrate 2, a first ceramic insulating substrate 2a, a third metal film 2b, a fourth metal film 2c, solder 3a, solder 3b, solder 3c, solder 3d, solder 3e, solder 3f, solder 3g, solder 3h, a second DCB substrate 4, a second ceramic insulating substrate 4a, a fifth metal film 4b, a sixth metal film 4c, a first pin wiring substrate 5, a first pin wiring insulating substrate 5a, a first metal film (circuit layer) 5b, a second metal film 5c, a first cooler 6, a first cooling medium path 6a, a first cooling medium inlet 6b, a first cooling medium outlet 6c, a first fin 6d, a distribution portion 6e, a water collection portion 6f, a second cooler 7, a second cooling medium path 7a, a second cooling medium inlet 7b, a second cooling medium outlet 7c, a second fin 7d, a distribution portion 7e, a water collection portion 7f, a first power terminal 8a, a second power terminal 8b, a third power terminal 8c, a sealing resin 9, a first pin 10, a first control terminal 11a, a second control terminal 11b, a connection member 12, a second semiconductor element 13, a second pin 14, a second pin wiring substrate 15, a second pin wiring insulating substrate 15a, a seventh metal film (circuit layer) 15b, and an eighth metal film 15c (see FIG. 1).

The first semiconductor element 1 and the second semiconductor element 13 are not particularly limited. For example, each of the first semiconductor element 1 and the second semiconductor element 13 may be an insulated gate bipolar transistor (IGBT), a power metal oxide semiconductor field effect transistor (MOSFET), or a free wheeling diode (FWD). Alternatively, the semiconductor element may be a reverse blocking-insulated gate bipolar transistor (RB-IGBT) or a reverse conducting-insulated gate bipolar transistor (RC-IGBT) which is obtained by forming the transistors and the diode in one semiconductor element in the vertical direction.

The first pin 10 is electrically and thermally connected to the upper surface of the first semiconductor element 1. The second pin 14 is electrically and thermally connected to the lower surface of the second semiconductor element 13. The first pin 10 and the second pin 14 are suitably made of a metal material with low electrical resistance and high thermal conductivity. Specifically, the first pin 10 and the second pin are preferably made of copper. It is preferable that a plurality of first pins 10 and a plurality of second pins 14 are provided in one semiconductor element 1. In this case, it is possible to reduce electrical resistance and to improve thermal conductivity.

The first pin wiring substrate 5 includes the first pin wiring insulating substrate 5a, the first metal film (circuit layer) 5b, and the second metal film 5c. The first metal film 5b is provided on the lower surface of the first pin wiring insulating substrate 5a and the second metal film 5c is provided on the upper surface of the first pin wiring insulating substrate 5a. The first pin 10 passes through the first pin wiring insulating substrate 5a and the first metal film (circuit layer) 5b and the second metal film 5c are electrically connected to each other through the first pin 10.

The first cooler 6 is hollow and includes a plurality of first fins 6d. A cooling medium path 6a is formed between the first fins 6d. A cooling medium which is input to the first cooler 6 through the first cooling medium inlet 6b illustrated in FIG. 4 is distributed to each cooling medium path 6a by the distribution portion 6e. The cooling medium is heated by heat from the first cooler. Then, the cooling medium is collected by the water collection portion 6f and is discharged to the outside of the first cooler through the first cooling medium outlet 6c. The cooling medium is not particularly limited. For example, the following cooling media may be used: a liquid cooling medium such as an ethylene glycol solution or water; a gas cooling medium such as air; and a phase-changeable cooling medium, such as chlorofluorocarbon, which is evaporated by a cooler and cools the cooler with evaporation heat. The first cooler 6 is thermally connected to the fourth metal film 2c.

The second cooler 7 is hollow and includes a plurality of second fins 7d. A cooling medium path 7a is formed between the second fins 7d. A cooling medium which is input to the second cooler 7 through the second cooling medium inlet 7b illustrated in FIG. 4 is distributed to each cooling medium path 7a by the distribution portion 7e. The cooling medium is heated by heat from the second cooler. Then, the cooling medium is collected by the water collection portion 7f and is discharged to the outside of the second cooler through the second cooling medium outlet 7c. The cooling medium is not particularly limited. For example, the following cooling media may be used: a liquid cooling medium such as an ethylene glycol solution or water; a gas cooling medium such as air; and a phase-changeable cooling medium, such as chlorofluorocarbon, which is evaporated by a cooler and cools the cooler with evaporation heat. The second cooler 7 is thermally connected to the sixth metal film 4c.

The first DCB substrate 2 includes the first ceramic insulating substrate 2a, the third metal film 2b, and the fourth metal film 2c. The third metal film 2b is provided on the upper surface of the first ceramic insulating substrate 2a and the fourth metal film 2c is provided on the lower surface of the first ceramic insulating substrate 2a. The third metal film 2b of the first DCB substrate 2 is bonded to the lower surface of the semiconductor element 1. The DCB is an abbreviation of direct copper bonding. In the DCB, a metal film, such as a copper film, is directly bonded to a ceramic insulating substrate.

The second DCB substrate 4 includes the second ceramic insulating substrate 4a, the fifth metal film 4b, and the sixth metal film 4c. The fifth metal film 4b is provided on the lower surface of the second ceramic insulating substrate 4a and the sixth metal film 4c is provided on the upper surface of the second ceramic insulating substrate 4a. The second DCB substrate 4 is provided between the second semiconductor element 13 and the second cooler 7. The fifth metal film 4b and the second semiconductor element 13 are electrically and thermally connected to each other. The sixth metal film 4c and the second cooler 7 are thermally connected to each other. Since the second ceramic insulating substrate 4a has an insulation property, the fifth metal film 4b and the sixth metal film 4c are electrically insulated from each other.

The second pin wiring substrate 15 includes the second pin wiring insulating substrate 15a, the seventh metal film (circuit layer) 15b, and the eighth metal film 15c. The seventh metal film 15b is provided on the upper surface of the second pin wiring insulating substrate 15a and the eighth metal film 15c is provided on the lower surface of the second pin wiring insulating substrate 15a. The second pin 14 passes through the second pin wiring insulating substrate 15a. The seventh metal film (circuit layer) 15b and the eighth metal film 15c are electrically connected to each other through the second pin 14.

The connection member 12 is provided between the second metal film 5c of the first pin wiring substrate 5 and the fifth metal film 4b of the second DCB substrate 4 and is electrically and thermally connected therebetween. The connection member 12 is suitably made of a metal material with low electrical resistance and high thermal conductivity. Specifically, the connection member 12 is preferably made of copper.

The first power terminal 8a is electrically connected to the third metal film 2b of the first DCB substrate 2. The second power terminal 8b is electrically connected to the fifth metal film 4b of the second DCB substrate 4. The third power terminal 8c is electrically connected to the eighth metal film 15c of the second pin wiring substrate 15. The power terminals 8a, 8b, and 8c extend from between the first cooler 6 and the second cooler to the outside. The power terminals 8a, 8b, and 8c are soldered to the metal films 2b, 4b, and 15c, respectively, which are not illustrated in the drawings.

The first control terminal 11a is used to control the first semiconductor element 1 and the first semiconductor element 1 is controlled from the outside. The second control terminal 11b is used to control the second semiconductor element 13 and the second semiconductor element 13 is controlled from the outside.

The solder 3a electrically and thermally connects the lower surface of the first semiconductor element 1 and the third metal film 2b. The solder 3b connects the fourth metal film 2c of the first DCB substrate 2 and the outer wall of the first cooler 6 and transfers heat, which has been transferred from the first semiconductor element 1 to the first DCB substrate 2, to the first cooler 6. The solder 3c electrically and thermally connects the upper surface of the first semiconductor element 1 and the first pin 10. The solder 3d electrically and thermally connects the second metal film 5c of the first pin wiring substrate 5 and the connection member 12. The solder 3e electrically and thermally connects the connection member 12 and the fifth metal film 4b of the second DCB substrate 4. The solder 3f electrically and thermally connects the sixth metal film 4c of the second DCB substrate 4 and the outer wall of the second cooler 7. The solder 3g electrically and thermally connects the second semiconductor element 13 and the fifth metal film 4b of the second DCB substrate 4. The solder 3h electrically and thermally connects the lower surface of the second semiconductor element 13 and the second pin 14.

The semiconductor module 100 is sealed with the sealing resin 9 except for a bonding surface between the first cooler 6 and the fourth metal film 2c of the first cooler 6 in the semiconductor module 100, a bonding surface between the second cooler 7 and the sixth metal film 4c of the second cooler 7 in the semiconductor module 100, and regions of the first power terminal 8a, the second power terminal 8b, the third power terminal 8c, the first control terminal 11a, and the second control terminal 11b which extend to the outside. The sealing resin 9 is not particularly limited as long as it has a predetermined insulation performance and is easy to mold. For example, an epoxy resin is preferably used as the sealing resin 9. In FIG. 1, the position of the sealing resin 9 is represented by a dashed line such that other components can be seen. FIG. 1 illustrates the state of the semiconductor module excluding the sealing resin 9.

Since a central portion of the semiconductor module 100 which is interposed between the first cooler 6 and the second cooler is surrounded by the first ceramic insulating substrate 2a of the first DCB substrate 2, the second ceramic insulating substrate 4a of the second DCB substrate 4, and the sealing resin 9, the insulation performance is ensured. The main power is input to and output from the outside through the power terminals 8a, 8b, and 8c. As illustrated in FIGS. 2A, 2B, the first power terminal 8a, the second power terminal 8b, the third power terminal 8c, the first control terminal 11a, and the second control terminal 11b extend to the outside of the semiconductor module in a direction parallel to one direction.

FIG. 3 illustrates a semiconductor module unit 100a. FIG. 3 illustrates a state in which the first cooler 6, the second cooler 7, the solder 3b, and the solder 3f are excluded from the semiconductor module illustrated in FIG. 1.

FIG. 4 illustrates a semiconductor module in which a plurality of semiconductor module units 100a is arranged in a row such that surfaces from which no terminal protrudes face each other and each of the first cooler and the second cooler is integrated with the semiconductor module units so as to entirely cover both side surfaces of the row of the semiconductor module units. As illustrated in FIGS. 1 and 4, the number of semiconductor module units 100a may be one or two or more.

The first cooler 6 includes the cooling medium inlet 6b and the cooling medium outlet 6c. The second cooler 7 includes the cooling medium inlet 7b and the cooling medium outlet 7c. It is preferable that the flow directions of the cooling medium in the first cooler 6 and the second cooler 7 be opposite to each other. In this case, it is possible to effectively cool the semiconductor module 100.

In the first embodiment, a plurality of sets of the first semiconductor element 1, the second semiconductor element 13, the first pin 10, and the second pin 14 may be provided. When a plurality of first semiconductor elements 1 and a plurality of second semiconductor elements are arranged so as to be connected in parallel to each other, it is possible to increase a rated output which can be processed by the semiconductor module. In addition, a plurality of first semiconductor elements 1 and second semiconductor elements 13 may be different types. For example, an IGBT and an FWD may be connected in parallel to each other.

According to the above-described embodiment of the invention, it is possible to provide a semiconductor module which uses pin bonding and can improve cooling capacity.

Second Embodiment

Figure 5:
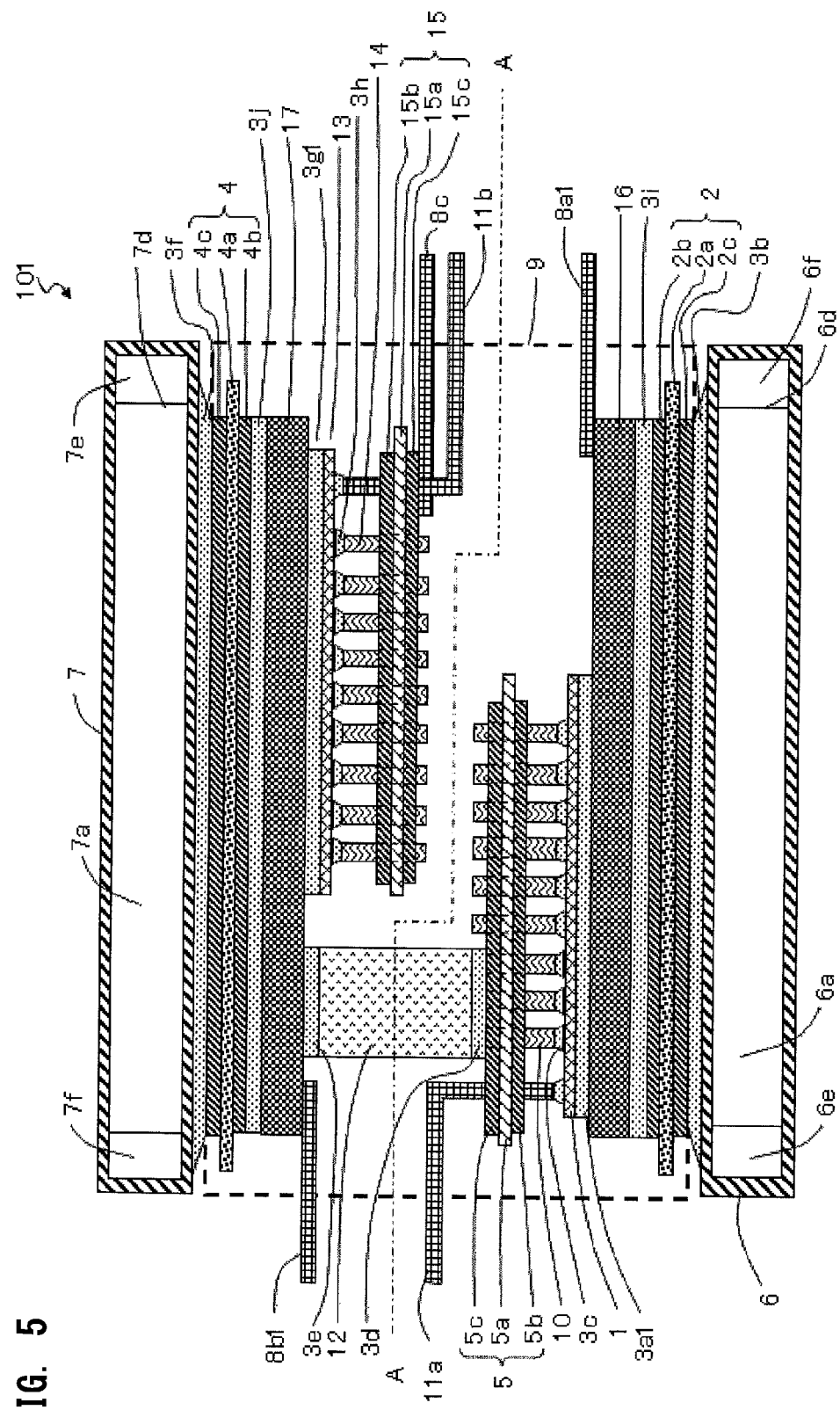
FIG. 5 is a cross-sectional view illustrating a semiconductor module according to a second embodiment of the invention.

A second embodiment of the invention will be described. FIG. 5 is a cross-sectional view illustrating a semiconductor module according to the second embodiment of the invention. The second embodiment differs from the first embodiment in that a semiconductor module 101 includes solder 3i, solder 3j, a first heat spreader 16, and a second heat spreader 17, in addition to the structure according to the first embodiment.

In the semiconductor module 101, the first heat spreader 16 is provided between the first semiconductor element 1 and the third metal film 2b so as to be electrically and thermally connected to the first semiconductor element 1 and the third metal film 2b and the second heat spreader 17 is provided between the second semiconductor element 13 and the fifth metal film 4b so as to be electrically and thermally connected to the second semiconductor element 13 and the fifth metal film 4b. The first heat spreader 16 and the second heat spreader 17 are made of a metal material with high thermal conductivity. For example, the first heat spreader 16 and the second heat spreader 17 are preferably made of copper. The thickness of the first heat spreader 16 and the second heat spreader 17 is designed on the basis of the amount of heat generated from the first semiconductor element 1 and the second semiconductor element 13, an increase in the amount of heat which is transiently generated, and the tolerance of the cooling capacity of the first cooler 6 and the second cooler 7.

A first power terminal 8a1 corresponding to the first power terminal 8a according to the first embodiment is electrically connected to the first heat spreader 16. A second power terminal 8b1 corresponding to the second power terminal 8b according to the first embodiment is electrically connected to the second heat spreader 17.

Third Embodiment

Figure 6:
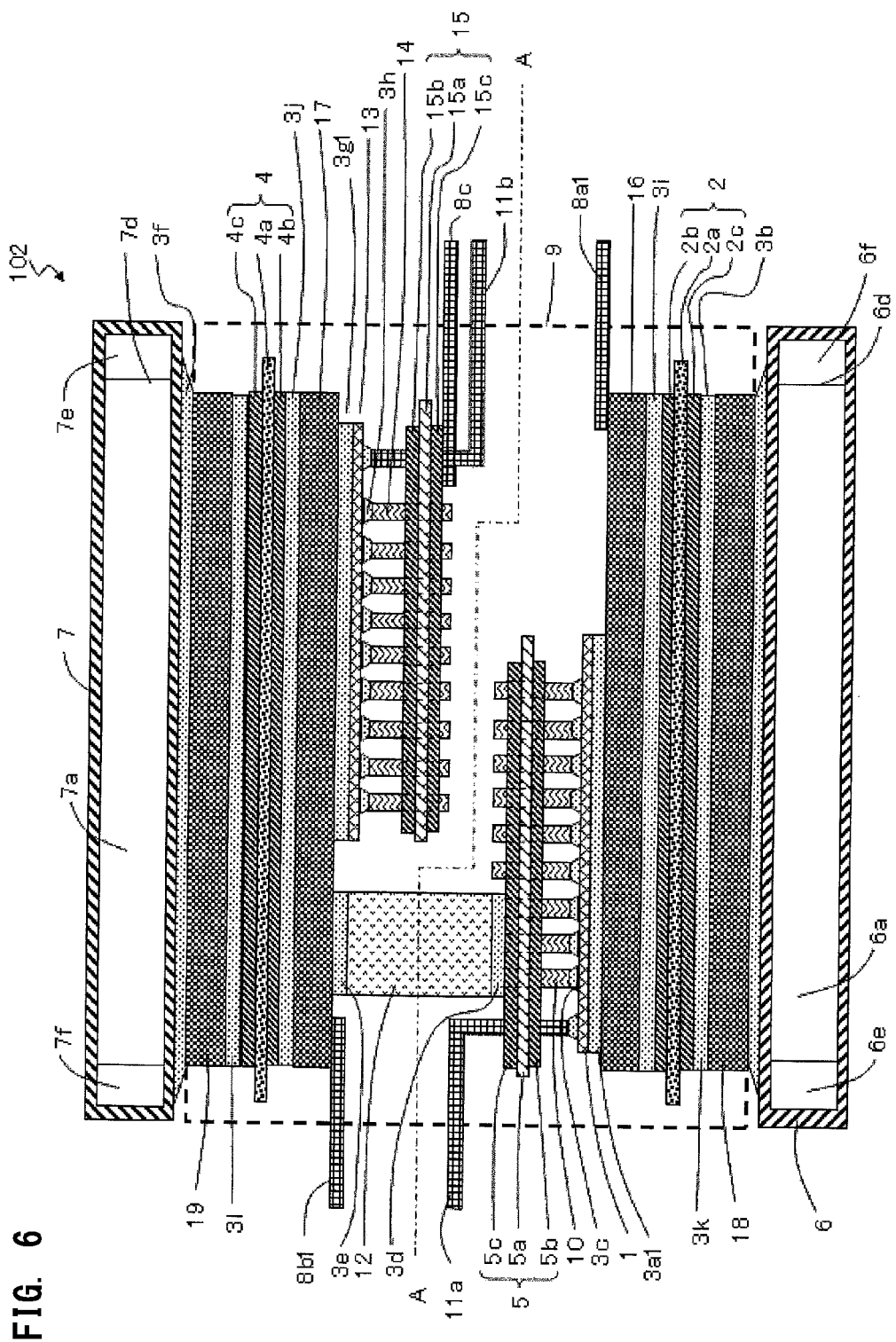
FIG. 6 is a cross-sectional view illustrating a semiconductor module according to a third embodiment of the invention.

A third embodiment of the invention will be described. FIG. 6 is a cross-sectional view illustrating a semiconductor module according to the third embodiment of the invention. The third embodiment differs from the second embodiment in that a semiconductor module 102 includes solder 3k, solder 3l, a third heat spreader 18, and a fourth heat spreader 19, in addition to the structure according to the second embodiment.

In the semiconductor module 102, the third heat spreader 18 is provided between the fourth metal film 2c and the first cooler 6 so as to be thermally connected to the fourth metal film 2c and the first cooler 6 and the fourth heat spreader 19 is provided between the sixth metal film 4c and the second cooler 7 so as to be thermally connected to the sixth metal film 4c and the second cooler 7. The third heat spreader 18 and the fourth heat spreader 19 are made of a metal material with high thermal conductivity. For example, the third heat spreader 18 and the fourth heat spreader 19 are preferably made of copper. The thickness of the third heat spreader 18 and the fourth heat spreader 19 is designed on the basis of the amount of heat generated from the first semiconductor element 1 and the second semiconductor element 13, an increase in the amount of heat which is transiently generated, and the tolerance of the cooling capacity of the first cooler 6 and the second cooler 7.

Since the third heat spreader 18 and the fourth heat spreader 19 are provided, the thermal diffusion of the semiconductor module 102 is accelerated and it is possible to improve cooling capacity.

As such, according to the first, second, and third embodiments of the invention, it is possible to provide a semiconductor module which uses pin bonding and can improve cooling capacity.

EXPLANATIONS OF LETTERS OR NUMERALS

1 FIRST SEMICONDUCTOR ELEMENT
2 FIRST DCB SUBSTRATE
2a FIRST CERAMIC INSULATING SUBSTRATE
2b THIRD METAL FILM
2c FOURTH METAL FILM
3a, 3a1, 3b, 3c, 3d, 3e, 3f, 3g, 3g1, 3h, 3i, 3j, 3k, 3l SOLDER
4 SECOND DCB SUBSTRATE
4a SECOND CERAMIC INSULATING SUBSTRATE
4b FIFTH METAL FILM
4c SIXTH METAL FILM
5 FIRST PIN WIRING SUBSTRATE

5a FIRST PIN WIRING INSULATING SUBSTRATE
5b FIRST METAL FILM (CIRCUIT LAYER)
5c SECOND METAL FILM
6 FIRST COOLER
6a FIRST COOLING MEDIUM PATH
6b FIRST COOLING MEDIUM INLET
6c FIRST COOLING MEDIUM OUTLET
6d FIRST FIN
6e DISTRIBUTION PORTION
6f WATER COLLECTION PORTION
7 SECOND COOLER
7a SECOND COOLING MEDIUM PATH
7b SECOND COOLING MEDIUM INLET
7c SECOND COOLING MEDIUM OUTLET
7d SECOND FIN
7e DISTRIBUTION PORTION
7f WATER COLLECTION PORTION
8a FIRST POWER TERMINAL
8a1 FIRST POWER TERMINAL
8b SECOND POWER TERMINAL
8b1 SECOND POWER TERMINAL
8c THIRD POWER TERMINAL
9 SEALING RESIN
10 FIRST PIN
11a FIRST CONTROL TERMINAL
11b SECOND CONTROL TERMINAL
12 CONNECTION MEMBER
13 SECOND SEMICONDUCTOR ELEMENT
14 SECOND PIN
15 SECOND PIN WIRING SUBSTRATE
15a SECOND PIN WIRING INSULATING SUBSTRATE
15b SEVENTH METAL FILM (CIRCUIT LAYER)
15c EIGHTH METAL FILM
16 FIRST HEAT SPREADER
17 SECOND HEAT SPREADER
18 THIRD HEAT SPREADER
19 FOURTH HEAT SPREADER
100 SEMICONDUCTOR MODULE
100a SEMICONDUCTOR MODULE UNIT
101 SEMICONDUCTOR MODULE
102 SEMICONDUCTOR MODULE

What is claimed is:

1. A semiconductor module comprising:
a first semiconductor element;
a first pin electrically and thermally connected to an upper surface of the first semiconductor element;
a first pin wiring substrate including a first pin wiring insulating substrate, a first metal film disposed on a lower surface of the first pin wiring insulating substrate, and a second metal film disposed on an upper surface of the first pin wiring insulating substrate, the first metal film, the second metal film and the first pin being electrically bonded together;
a first direct copper bonding substrate including a first ceramic insulating substrate, a third metal film disposed on an upper surface of the first ceramic insulating substrate and bonded to a lower surface of the first semiconductor element, and a fourth metal film disposed on a lower surface of the first ceramic insulating substrate;
a second semiconductor element;
a second pin electrically and thermally connected to a lower surface of the second semiconductor element;
a second direct copper bonding substrate including a second ceramic insulating substrate, a fifth metal film disposed on a lower surface of the second ceramic insulating substrate and bonded to an upper surface of the second semiconductor element, and a sixth metal film disposed on an upper surface of the second ceramic insulating substrate;
a second pin wiring substrate including a second pin wiring insulating substrate, a seventh metal film disposed on an upper surface of the second pin wiring insulating substrate, and an eighth metal film disposed on a lower surface of the second pin wiring insulating substrate, the seventh metal film, the eighth metal film and the second pin being electrically bonded together;
a connection member having two ends electrically connected to the second metal film and the fifth metal film, respectively;
a first cooler thermally connected to the fourth metal film; and
a second cooler thermally connected to the sixth metal film.

2. The semiconductor module according to claim 1, further comprising:
a first heat spreader disposed between the first semiconductor element and the third metal film to be electrically and thermally connected to the first semiconductor element and the third metal film, and
a second heat spreader disposed between the second semiconductor element and the fifth metal film to be electrically and thermally connected to the second semiconductor element and the fifth metal film.

3. The semiconductor module according to claim 2, further comprising:
a third heat spreader disposed between the fourth metal film and the first cooler to be thermally connected to the fourth metal film and the first cooler, and
a fourth heat spreader disposed between the sixth metal film and the second cooler to be thermally connected to the sixth metal film and the second cooler.

4. The semiconductor module according to claim 1, further comprising:
a terminal electrically connected to the first semiconductor element or the second semiconductor element, and extending between the first cooler and the second cooler to outside.

5. The semiconductor module according to claim 4, further comprising a sealing resin sealing the semiconductor module except for a bonding surface between the first cooler and the fourth metal film of the first cooler in the semiconductor module, a bonding surface between the second cooler and the sixth metal film of the second cooler in the semiconductor module, and a region of the terminal extending to the outside.

6. The semiconductor module according to claim 4, wherein the terminal extends to the outside of the semiconductor module in a direction parallel to one direction,
the first cooler includes a first cooling medium inlet for introducing a cooling medium and a first cooling medium outlet for discharging the cooling medium,
the second cooler includes a second cooling medium inlet for introducing a cooling medium and a second cooling medium outlet for discharging the cooling medium, and
the first cooling medium inlet, the first cooling medium outlet, the second cooling medium inlet, and the second cooling medium outlet extend in a direction perpendicular to an extending direction of the terminal to be separated from each other.

7. A semiconductor module comprising:
a plurality of semiconductor module units each having, as a unit module, the semiconductor module according to claim 1,
wherein the plurality of semiconductor module units is arranged in a row so that a surface of each of the plurality of semiconductor module units from which the terminal does not protrude face each other.

8. The semiconductor module according to claim 7, wherein each of the first cooler and the second cooler is integrated with the semiconductor module units to entirely cover two side surfaces of the row of the semiconductor module units.

* * * * *

UNITED STATES PATENT AND TRADEMARK OFFICE
CERTIFICATE OF CORRECTION

| | | |
|---|---|---|
| PATENT NO. | : 9,520,337 B2 | Page 1 of 1 |
| APPLICATION NO. | : 14/939531 | |
| DATED | : December 13, 2016 | |
| INVENTOR(S) | : Takafumi Yamada | |

It is certified that error appears in the above-identified patent and that said Letters Patent is hereby corrected as shown below:

In the Specification

Please change Column 6, Line 55, from "pin are ..." to --pin 14 are ...--.

Please change Column 8, Line 22, from "... second cooler to ..." to --... second cooler 7 to ...--.

Signed and Sealed this
Second Day of May, 2017

Michelle K. Lee
*Director of the United States Patent and Trademark Office*